(12) United States Patent
D'Evelyn

(10) Patent No.: US 8,148,801 B2
(45) Date of Patent: Apr. 3, 2012

(54) NITRIDE CRYSTAL WITH REMOVABLE SURFACE LAYER AND METHODS OF MANUFACTURE

(75) Inventor: Mark P. D'Evelyn, Goleta, CA (US)

(73) Assignee: Soraa, Inc., Goleta, CA (US)

( * ) Notice: Subject to any disclaimer, the term of this patent is extended or adjusted under 35 U.S.C. 154(b) by 94 days.

(21) Appl. No.: 12/546,458

(22) Filed: Aug. 24, 2009

(65) Prior Publication Data

US 2010/0219505 A1    Sep. 2, 2010

Related U.S. Application Data

(60) Provisional application No. 61/091,591, filed on Aug. 25, 2008.

(51) Int. Cl.
*H01L 29/20* (2006.01)

(52) U.S. Cl. .................. 257/615; 257/E29.089; 257/79

(58) Field of Classification Search .......... 257/79, 257/86, 94, 103, 183, 200, 615, 478, E29.089, 257/E21.09

See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,430,051 A | 2/1984 | Von Platen |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,541,115 B2 | 4/2003 | Pender et al. |
| 6,596,040 B2 | 7/2003 | Saak et al. |
| 6,596,079 B1 | 7/2003 | Vaudo et al. |

(Continued)

FOREIGN PATENT DOCUMENTS

JP    2005-289797 A2    10/2005

(Continued)

OTHER PUBLICATIONS

International Search Report & Written Opinion of PCT Application No. PCT/US09/54952, date of mailing Oct. 21, 2009, 15 pages total.

(Continued)

*Primary Examiner* — Roy Potter

(57) ABSTRACT

A nitride crystal or wafer with a removable surface layer comprises a high quality nitride base crystal, a release layer, and a high quality epitaxial layer. The release layer has a large optical absorption coefficient at wavelengths where the base crystal is substantially transparent and may be etched under conditions where the nitride base crystal and the high quality epitaxial layer are not. The high quality epitaxial layer may be removed from the nitride base crystal by laser liftoff or by chemical etching after deposition of at least one epitaxial device layer. The nitride crystal with a removable surface layer is useful as a substrate for a light emitting diode, a laser diode, a transistor, a photodetector, a solar cell, or for photo-electrochemical water splitting for hydrogen generation.

37 Claims, 2 Drawing Sheets

U.S. PATENT DOCUMENTS

| | | | |
|---|---|---|---|
| 6,639,925 B2 | 10/2003 | Niwa et al. | |
| 6,656,615 B2 | 12/2003 | Dwilinski et al. | |
| 6,764,297 B2 | 7/2004 | Godwin et al. | |
| 6,765,240 B2* | 7/2004 | Tischler et al. | 257/183 |
| 6,806,508 B2 | 10/2004 | D'Evelyn et al. | |
| 6,858,882 B2 | 2/2005 | Tsuda et al. | |
| 6,861,130 B2 | 3/2005 | D'Evelyn et al. | |
| 6,936,488 B2 | 8/2005 | D'Evelyn et al. | |
| 6,955,719 B2 | 10/2005 | Dmitriev et al. | |
| 7,009,215 B2 | 3/2006 | D'Evelyn et al. | |
| 7,033,858 B2 | 4/2006 | Chai et al. | |
| 7,053,413 B2* | 5/2006 | D'Evelyn et al. | 257/79 |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,122,827 B2 | 10/2006 | Alizadeh et al. | |
| 7,125,453 B2 | 10/2006 | D'Evelyn et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,208,393 B2 | 4/2007 | Haskell et al. | |
| 7,220,658 B2 | 5/2007 | Haskell et al. | |
| 7,291,544 B2 | 11/2007 | D'Evelyn et al. | |
| 7,316,746 B2 | 1/2008 | D'Evelyn et al. | |
| 7,335,262 B2 | 2/2008 | Dwilinski et al. | |
| 7,338,828 B2 | 3/2008 | Imer et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,572,425 B2 | 8/2009 | McNulty et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 2001/0011935 A1 | 8/2001 | Lee et al. | |
| 2001/0048114 A1 | 12/2001 | Morita et al. | |
| 2002/0105986 A1 | 8/2002 | Yamasaki | |
| 2003/0027014 A1 | 2/2003 | Johnson et al. | |
| 2003/0140845 A1 | 7/2003 | D'Evelyn et al. | |
| 2003/0145784 A1 | 8/2003 | Thompson et al. | |
| 2003/0183155 A1 | 10/2003 | D'Evelyn et al. | |
| 2003/0232512 A1 | 12/2003 | Dickinson et al. | |
| 2004/0000266 A1 | 1/2004 | D'Evelyn et al. | |
| 2004/0104391 A1 | 6/2004 | Maeda et al. | |
| 2004/0222357 A1 | 11/2004 | King et al. | |
| 2005/0098095 A1 | 5/2005 | D'Evelyn et al. | |
| 2005/0109240 A1 | 5/2005 | Maeta et al. | |
| 2005/0191773 A1 | 9/2005 | Suzuki et al. | |
| 2005/0205215 A1 | 9/2005 | Giddings et al. | |
| 2006/0030738 A1 | 2/2006 | Vanmaele et al. | |
| 2006/0037529 A1 | 2/2006 | D'Evelyn et al. | |
| 2006/0038193 A1 | 2/2006 | Wu et al. | |
| 2006/0048699 A1 | 3/2006 | D'Evelyn et al. | |
| 2006/0096521 A1 | 5/2006 | D'Evelyn et al. | |
| 2006/0177362 A1 | 8/2006 | D'Evelyn et al. | |
| 2006/0207497 A1 | 9/2006 | D'Evelyn et al. | |
| 2006/0213429 A1 | 9/2006 | Motoki et al. | |
| 2006/0228870 A1 | 10/2006 | Oshima | |
| 2006/0246687 A1 | 11/2006 | Kaiser et al. | |
| 2006/0289386 A1 | 12/2006 | Tysoe et al. | |
| 2007/0015345 A1 | 1/2007 | Baker et al. | |
| 2007/0077674 A1 | 4/2007 | Okuyama et al. | |
| 2007/0141819 A1 | 6/2007 | Park | |
| 2007/0142204 A1 | 6/2007 | Park et al. | |
| 2007/0151509 A1 | 7/2007 | Park | |
| 2007/0158785 A1 | 7/2007 | D'Evelyn et al. | |
| 2007/0164292 A1 | 7/2007 | Okuyama | |
| 2007/0166853 A1 | 7/2007 | Guenther et al. | |
| 2007/0178039 A1 | 8/2007 | D'Evelyn et al. | |
| 2007/0181056 A1 | 8/2007 | D'Evelyn et al. | |
| 2007/0190758 A1 | 8/2007 | Kaeding et al. | |
| 2007/0197004 A1 | 8/2007 | Dadgar et al. | |
| 2007/0210074 A1 | 9/2007 | Maurer et al. | |
| 2007/0234946 A1 | 10/2007 | Hashimoto et al. | |
| 2007/0252164 A1 | 11/2007 | Zhong et al. | |
| 2008/0008855 A1 | 1/2008 | D'Evelyn et al. | |
| 2008/0083741 A1 | 4/2008 | Giddings et al. | |
| 2008/0087919 A1 | 4/2008 | Tysoe et al. | |
| 2008/0156254 A1 | 7/2008 | Dwilinski et al. | |
| 2008/0193363 A1 | 8/2008 | Tsuji | |
| 2008/0272462 A1 | 11/2008 | Shimamoto | |
| 2008/0285609 A1 | 11/2008 | Ohta et al. | |
| 2009/0301387 A1 | 12/2009 | D'Evelyn | |
| 2009/0301388 A1 | 12/2009 | D'Evelyn | |
| 2009/0320744 A1 | 12/2009 | D'Evelyn | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |

FOREIGN PATENT DOCUMENTS

| | | |
|---|---|---|
| JP | 2007-039321 A | 2/2007 |

OTHER PUBLICATIONS

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwilinski et al, AMMONO Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

ISO et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820- L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Wang et al. "Ammonothermal growth of GaN crystals in alkaline solutions," Journal of crystal Growth 287:376-380 (Jan. 2006).

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

* cited by examiner

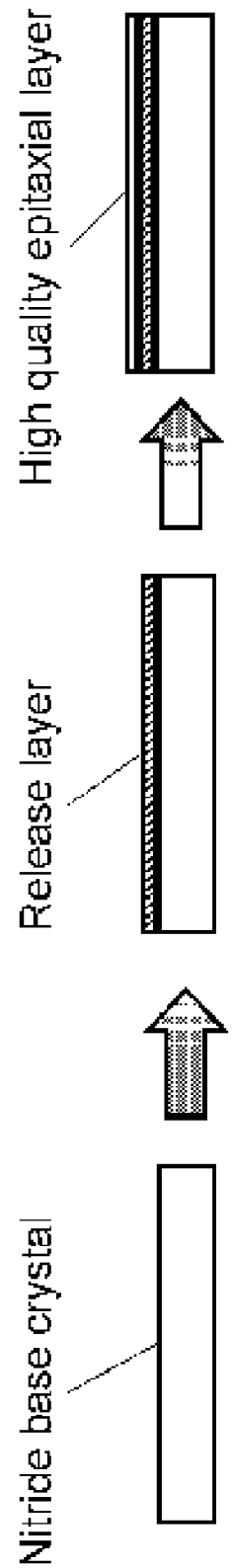
Fig. 1: Substrate fabrication

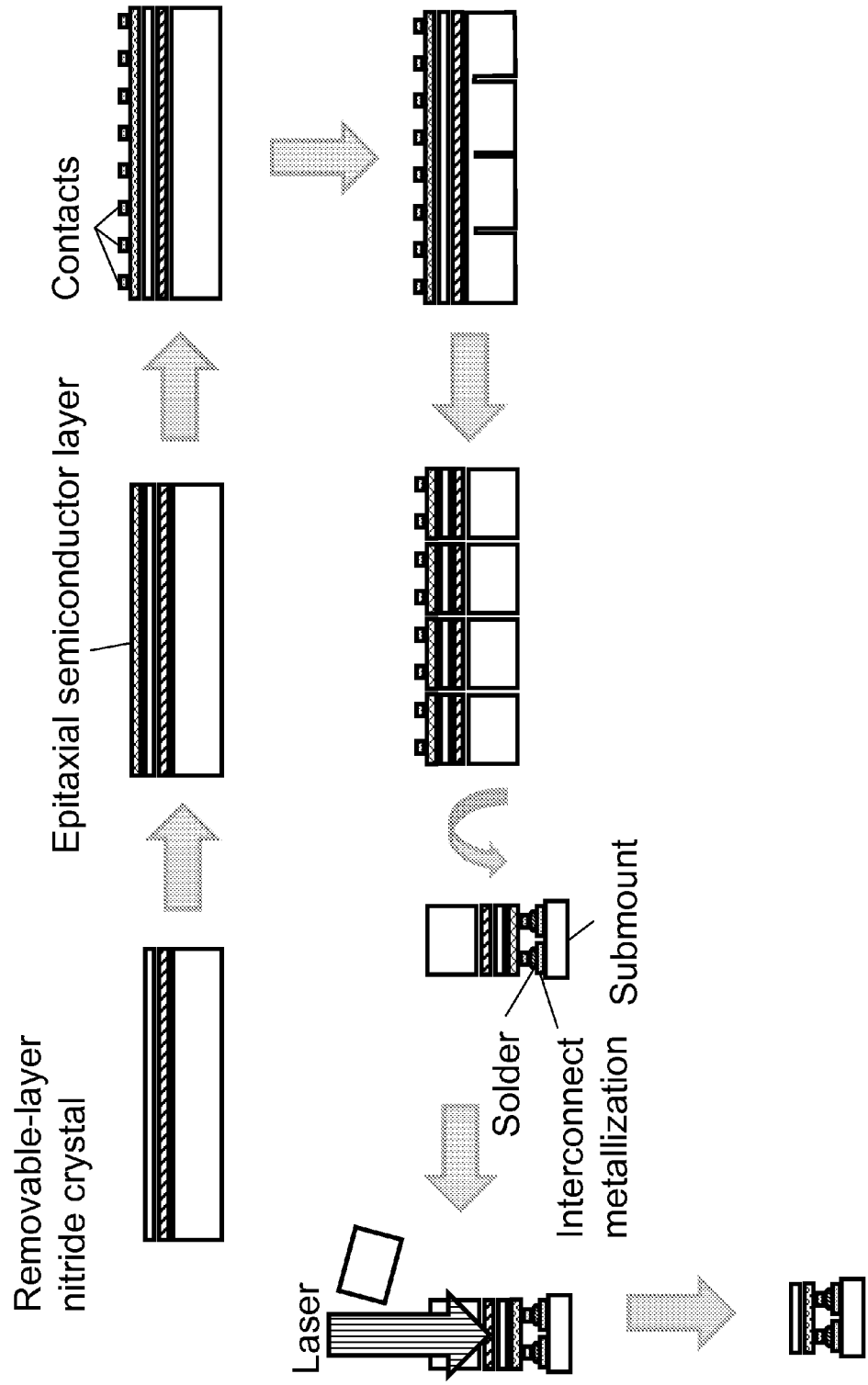

NITRIDE CRYSTAL WITH REMOVABLE SURFACE LAYER AND METHODS OF MANUFACTURE

CROSS-REFERENCES TO RELATED APPLICATIONS

This application claims priority to U.S. Provisional Patent Application No. 61/091,591, filed Aug. 25, 2008, commonly assigned, which is incorporated by reference in its entirety herein.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention generally relates to processing of crystals. More particularly, the present invention provides a method for obtaining a gallium-containing nitride crystal with a release layer, but there can be others. In other embodiments, the present invention provides a method of manufacture of a high quality epitaxial gallium containing crystal with a release layer, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride (GaN) based optoelectronic and electronic devices are of tremendous commercial importance. However, the quality and reliability of these devices is compromised by very high defect levels, particularly threading dislocations, grain boundaries, and strain in semiconductor layers of the devices. Dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth method of the layers.

The presence of defects has a deleterious effect on epitaxially-grown layers, compromising electronic device performance and requiring complex, tedious fabrication steps to reduce the concentration and/or impact of the defects. While a substantial number of growth methods for gallium nitride crystals have been proposed, the methods to date still merit improvement.

For some applications, it is desirable to remove most or all of the substrate from the GaN-based device. For example, it may be possible to remove heat more effectively from an active layer using flip-chip bonding. It may also be possible to extract light more efficiently from a light-emitting diode (LED) when the substrate is removed. In the case of an ultraviolet light emitting diode (UV-LED), with an emission wavelength shorter than 365 nanometers, a low-defect bulk GaN substrate would absorb much of the emitted light.

Several authors have demonstrated substrate-release techniques to separate GaN-based epitaxial layer from non-GaN substrates. For example, Fujii et al. [Applied Physics Letters 84, 855 (2004) fabricated LEDs on a sapphire substrate, laser-lifted-off the sapphire substrate, and then roughened the newly exposed (0 0 0 -1) GaN surface to improve light extraction. Similarly, Kawasaki et al. [Applied Physics Letters 89, 261114 (2006) fabricated a UV-LED emitting at 322 nm by deposition of AlGaN active layers on sapphire, followed by laser lift-off of the sapphire. In a different approach, Ha et al. [IEEE Photonics Technology Letters 20, 175 (2008)] fabricated a vertical LED by depositing GaN-based epitaxial device layers on a CrN layer which in turn was deposited on a sapphire substrate, followed by chemical etching of the CrN layer. Oshima et al. [Physica Status Solidi (a) 194, 554 (2002)] fabricated thick, removable GaN layers using a TiN release layer, in which pores or voids were generated by etching in $H_2$. However, these methods were developed for GaN layers on non-GaN substrates and, as a consequence, the epitaxial device layers have a relatively high dislocation density. It is possible to reduce the surface dislocation density by methods that are known in the art, such as epitaxial lateral overgrowth, but these methods generally are not able to produce layers with a dislocation density below about $10^5$ cm$^{-2}$ over the entire surface. In addition, the presence of voids or porosity may be deleterious to material quality in relatively thin epitaxial layers.

Significant progress has been made in the growth of bulk gallium nitride crystals and wafers with a low dislocation density, and GaN-based devices can be fabricated on these substrates rather than on sapphire. D'Evelyn et al. [U.S. Pat. No. 7,053,413, hereby incorporated by reference in its entirety] teach fabrication of a homoepitaxial LED on a bulk GaN substrate with a dislocation density below $10^4$ cm$^{-2}$, followed by removal of a portion of the substrate. However, the only means taught for removal of the portion of the substrate are lapping, polishing, chemical etching, plasma etching, and ion beam etching. These methods do not provide a natural endpoint, and it is therefore difficult to remove all but a few-micron-thick layer of uniform thickness, and are slow and expensive to perform.

What is needed is a means for providing a low dislocation-density substrate for homoepitaxial device manufacturing, where all but a few microns or less of the substrate can be removed or released accurately and cost effectively on a manufacturing scale.

BRIEF SUMMARY OF THE INVENTION

According to the present invention, techniques related to processing of crystals is provided. More particularly, the present invention provides a method for obtaining a gallium-containing nitride crystal with a release layer, but there can be others. In other embodiments, the present invention provides a method of manufacture of a high quality epitaxial gallium containing crystal with a release layer, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present invention provides a nitride crystal with a removable surface layer. The crystal has a high quality nitride base crystal, comprising a nitrogen species and having a surface dislocation density below $10^5$ cm$^{-2}$. The crystal has a release layer having an optical absorption coefficient greater than 1000 cm$^{-1}$ at least one wavelength where the high quality nitride base crystal is substantially transparent, with an optical absorption coefficient less than 50 cm$^{-1}$. The crystal also has a high quality epitaxial layer, between 0.05 micron and 500 microns thick, comprising nitrogen and having a surface dislocation density below $10^5$ cm$^{-2}$.

In an alternative specific embodiment, the present invention provides a method of making a nitride crystal with a removable surface layer. The method includes providing a high quality nitride base crystal, comprising a nitrogen species and having a surface dislocation density below $10^5$ cm$^{-2}$. In a specific embodiment, the high quality nitride base crystal comprises a surface region and forming a release layer overlying the surface region. The release layer has an optical absorption coefficient greater than 1000 cm$^{-1}$ at at least one wavelength where the high quality nitride base crystal is substantially transparent, with an optical absorption coefficient less than 50 cm$^{-1}$. The method includes forming a high quality epitaxial layer comprising a nitrogen species and having a surface dislocation density below $10^5$ cm$^{-2}$ overlying the release layer.

Still further, the present invention provides a method of processing a nitride crystal. The method includes depositing at least one high quality epitaxial semiconductor layer having a surface dislocation density below $10^5$ cm$^{-2}$ overlying a surface of a release layer overlying a nitride crystal substrate. In a specific embodiment, the nitride crystal substrate comprises a high quality nitride base crystal, comprising a nitrogen species and having a surface dislocation density below $10^5$ cm$^{-2}$. In a specific embodiment, the release layer has an optical absorption coefficient greater than 1000 cm$^{-1}$ at at least one wavelength where the base crystal is substantially transparent, with an optical absorption coefficient less than 50 cm$^{-1}$. The high quality epitaxial semiconductor layer comprises a nitrogen species and having a surface dislocation density below $10^5$ cm$^{-2}$. The method includes orienting the nitride crystal substrate comprising the base crystal, the release layer, and the high quality epitaxial semiconductor layer and separating the at least one epitaxial semiconductor layer from the high quality nitride base crystal via the release layer.

As used herein, the term "high quality" for a particular material refers to desired film quality having a dislocation density of less than $10^5$ cm$^{-2}$, but there can be others that are recited herein, and outside of the present specification recognized by one of ordinary skill in the art. Of course, one of ordinary skill in the art would recognize other variations, modifications, and alternatives.

Benefits are achieved over pre-existing techniques using the present invention. In particular, the present invention provides a method and device using a release layer for manufacture of high quality films such as such as GaN, AlN, InN, InGaN, and AlInGaN and others. In a specific embodiment, the present method and device use techniques that are relatively simple and cost effective. Depending upon the embodiment, the present apparatus and method can be manufactured using conventional materials and/or methods according to one of ordinary skill in the art. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 1 is a simplified diagram illustrating a method of manufacturing a gallium nitride substrate according to an embodiment of the present invention.

FIG. 2 is a simplified diagram illustrating another method of manufacturing and using a gallium nitride substrate according to an embodiment of the present invention.

DETAILED DESCRIPTION OF THE INVENTION

According to the present invention, techniques related to processing of crystals is provided. More particularly, the present invention provides a method for obtaining a gallium-containing nitride crystal with a release layer, but there can be others. In other embodiments, the present invention provides a method of manufacture of a high quality epitaxial gallium containing crystal with a release layer, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

According to a specific embodiment, a starting point for the method is a high quality nitride base crystal or wafer, comprising nitrogen, and with a surface dislocation density below $10^5$ cm$^{-2}$. The nitride base crystal or wafer may comprise $Al_xIn_yGa_{1-x-y}N$, where $0 \leq x$, y, $x+y \leq 1$ according to a specific embodiment. In one specific embodiment, the nitride base crystal comprises GaN. The nitride base crystal may be grown by an acidic ammonothermal process, as described by U.S. Pat. No. 7,078,731, which is hereby incorporated by reference in its entirety, but there can be others. In one or more embodiments, the nitride base crystal or wafer may have a large-surface orientation within ten degrees, within five degrees, within two degrees, within one degree, within 0.5 degree, or within 0.2 degree of (0 0 0 1), (0 0 0 –1), {1 –1 0 0}, {1 1 –2 0}, {1 –1 0 ±1}, {1 –1 0 ±2}, {1 –1 0 ±3}, {2 –2 0 ±1}, or {1 1 –2 ±2}. The nitride base crystal or wafer may have a surface dislocation density below $10^4$ cm$^{-2}$, below $10^3$ cm$^{-2}$, or below $10^2$ cm$^{-2}$. The nitride base crystal or wafer may have a c-plane dislocation density below $10^5$ cm$^{-2}$, below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$, below 5 cm$^{-1}$, or below 1 cm$^{-1}$ at wavelengths between about 465 nm and about 700 nm. The nitride base crystal may have an optical absorption coefficient below 100 cm$^{-1}$, below 50 cm$^{-1}$, below 5 cm$^{-1}$, or below 1 cm$^{-1}$ at wavelengths between about 700 nm and about 3077 nm and at wavelengths between about 3333 nm and about 6667 nm, and others. In some embodiments, the nitride base crystal is substantially free of low angle grain boundaries, or tilt boundaries. In other embodiments, the nitride base crystal comprises at least two tilt boundaries, with the separation between adjacent tilt boundaries not less than 3 mm.

In another embodiment, the high quality nitride base crystal or wafer is grown by a basic ammonothermal process, as described by U.S. Pat. No. 6,656,615, which is hereby incorporated by reference in its entirety. In yet another embodiment, the high quality nitride base crystal is grown by hydride vapor phase epitaxy, as described by U.S. Patent Application 2006/0228870A1, which is hereby incorporated by reference in its entirety. In still another embodiment, the high quality nitride base crystal is grown by a flux method, as described by U.S. Pat. Nos. 5,868,837, 7,063,741, 7,368,015, and PCT Patent Application WO 2005/121415A1, all of which are hereby incorporated by reference in their entirety. Of course, there can be other variations, modifications, and alternatives.

In some embodiments, the high quality nitride base crystal or wafer is prepared from a boule by sawing, multi-wire sawing, or the like. Of course, there can be other variations, modifications, and alternatives.

In a specific embodiment, the front surface of the high quality nitride base crystal or wafer may be treated using a polishing process. Polishing may be performed with a slurry containing diamond, silicon carbide, alumina, or other hard particles. Polishing may leave lattice damage in the GaN wafer that may be removed by a number of methods, including chemical mechanical polishing, dry etching by reactive ion etching (RIE), high density inductively-coupled plasma (ICP) plasma etching, electron cyclotron resonance (ECR) plasma etching, and chemically assisted ion beam etching (CAIBE). The polished wafer may have a root-mean-square (rms) surface roughness below about 1 nm, below 0.5 nm, below 0.2 nm, or below 0.1 nm over a lateral area of at least 10×10 µm2. The back surface of the high quality nitride base crystal or wafer may also be polished, with an rms surface roughness below 5 nanometers, below 2 nanometers, or below 1 nanometer. The base crystal or wafer may have a thickness between about 0.01 and 10 mm, or between about 0.05 and 0.5 mm. The surface of the base crystal or wafer is preferably flat to less than 1 micron. The front and back surfaces of the base crystal or wafer may be parallel to better than 1 degree.

As shown in FIG. 1, a release layer having an optical absorption coefficient greater than 1000 $cm^{-1}$ at at least one wavelength where the base crystal is substantially transparent, with an optical absorption coefficient less than 50 $cm^{-1}$, is then deposited on the base crystal. In some embodiments, the release layer has an optical absorption coefficient greater than 5000 $cm^{-1}$ at at least one wavelength where the base crystal is substantially transparent. In some embodiments, the release layer comprises $Al_xIn_yGa_{1-x-y}N$, where $0 \leq x$, y, $x+y \leq 1$. In some embodiments the release layer further comprises at least one impurity, to render the release layer strongly absorbing at some wavelengths. A number of dopant impurities, including H, O, C, Mn, Fe, and Co, may render an $Al_xIn_yGa_{1-x-y}N$ or GaN crystal colored. Heavy doping with cobalt, in particular, can render GaN black, that is, with a high optical absorption coefficient across the visible spectrum. In particular, the optical absorption coefficient may be greater than 5000 $cm^{-1}$ across the entire visible spectrum, including the range between about 465 nm and about 700 nm. The optical absorption coefficient may also be greater than 5000 $cm^{-1}$ between about 700 nm and about 3077 nm and at wavelengths between about 3333 nm and about 6667 nm. Incorporation of In can decrease the bandgap of GaN, leading to strong absorption at wavelengths where GaN or AlGaN are substantially transparent. However, the InGaN has inferior temperature stability and a larger lattice mismatch with respect to GaN or AlGaN than does heavily-doped GaN or AlGaN.

In some embodiments, a doped $Al_xIn_yGa_{1-x-y}N$ release layer is deposited on the base crystal by ammonothermal growth. For example, one or more base crystals are suspended below a silver baffle and placed inside a silver capsule. Polycrystalline GaN, $NH_4F$ mineralizer, $CoF_2$, and ammonia are added to the capsule in a ratio of approximately 0.3:0.1:0.03:1 and the capsule is sealed. The capsule is then inserted into a zero stroke high pressure high temperature apparatus. The cell is heated at about 11 degrees Celsius per minute until the temperature of the bottom of the capsule is approximately 700 degrees Celsius and the temperature of the top half of the capsule is approximately 635 degrees Celsius, as measured by type K thermocouples, and the temperatures are held at these values for 0.1-10 hours. The cell is then cooled and removed from the high pressure apparatus. The ammonia is removed from the capsule, the capsule is opened, and the GaN crystal is removed. A black, Co-doped GaN layer is deposited on the base crystal, approximately 0.5-50 microns thick. The newly-deposited GaN layer has a high crystal quality and an optical absorption coefficient greater than 1000 $cm^{-1}$ or greater than 5000 $cm^{-1}$ across the entire visible spectrum, including the range between about 465 nm and about 700 nm. The release layer has the same crystallographic orientation, to within about two degrees, as the base crystal and has a very high crystalline quality, comprises nitrogen and has a surface dislocation density below $10^5$ $cm^{-2}$. The release layer may have a surface dislocation density below $10^4$ $cm^{-2}$, below $10^3$ $cm^{-2}$, or below $10^2$ $cm^{-2}$. The release layer may have a c-plane dislocation density below $10^5$ $cm^{-2}$, below $10^4$ $cm^{-2}$, below $10^3$ $cm^{-2}$, or below $10^2$ $cm^{-2}$. In some embodiments, the strain in either or both of the a or c lattice constants of the epitaxial release layer, with respect to those of the base nitride crystal, is less than 0.1%, less than 0.01%, less than 0.005%, less than 0.002%, or less than 0.001%. In some embodiments, the release layer has an optical absorption coefficient above 5000 $cm^{-1}$ or above 5000 $cm^{-1}$ at wavelengths between about 700 nm and about 3077 nm and at wavelengths between about 3333 nm and about 6667 nm. In some embodiments, the release layer is substantially free of low angle grain boundaries, or tilt boundaries. In other embodiments, the release layer comprises at least two tilt boundaries, with the separation between adjacent tilt boundaries not less than 3 mm. Of course there can be other modifications, variations, and alternatives.

In some embodiments, the base crystal is etched prior to deposition of the release layer. Etching may be performed in situ. For example, prior to ammonothermal deposition of a doped nitride release layer, the temperature difference between the growth zone and the nutrient zone may be reversed, causing etching of one or more base crystals. In the case of ammonothermal deposition of a doped $Al_xIn_yGa_{1-x-y}N$ release layer using $NH_4F$ as a mineralizer, etching of the base crystal may be achieved by heating the bottom half of the capsule, containing the base crystals, to a temperature of approximately 700 degrees Celsius and by heating the top half of the capsule, containing polycrystalline GaN, to a temperature of approximately 700 to 750 degrees Celsius for a period between about 5 minutes and about two hours. The etching may remove damaged material at the surface of the base crystal, for example, which may be left over from sawing or polishing.

In another set of embodiments, a doped $Al_xIn_yGa_{1-x-y}N$ release layer is deposited on the base crystal by metalorganic chemical vapor deposition (MOCVD). At least one base crystal is placed on a susceptor in an MOCVD reactor. After closing, evacuating, and back-filling the reactor to atmospheric pressure, the susceptor is heated to a temperature between about 1000 and about 1200 degrees Celsius in the presence of a nitrogen-containing gas. In one specific embodiment, the susceptor is heated to approximately 1185 degrees Celsius under flowing ammonia. In one embodiment, an undoped GaN layer is grown first, to ensure complete layer coalescence. A flow of a gallium-containing metalorganic precursor, such as trimethylgallium (TMG) or triethylgallium (TEG) is initiated, at a rate between approximately 5 and approximately 50 standard cubic centimeters per minute (sccm) in a carrier gas. The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of a dopant precursor may be initiated in order to provide strong optical absorption. In some embodiments, the dopant precursor comprises at least one of cyclopentadienylcobalt dicarbonyl $((C_5H_5)Co(CO)_2)$, cobalt (II) acetylacetonate $(Co(CH_3C(O)CHC(O)CH_3)_2)$, cobalt tricarbonyl nitrosyl $(Co(CO)_3NO)$, dicobalt octacarbonyl $(Co_2(CO)_8)$, and tetracobalt dodecacarbonyl $(Co_4(CO)_{12})$. The dopant precursor may be provided along with a carrier gas comprising at least one of hydrogen, helium, nitrogen, or argon. The ratio of the flow of dopant precursor to gallium precursor may be between 0.001 and 1000. The newly-deposited release layer has a high crystal quality and an optical absorption coefficient greater than 1000 $cm^{-1}$ or greater than 5000 $cm^{-1}$ across the entire visible spectrum, including the range between about 465 nm and about 700 nm. The release layer has the same crystallographic orientation, to within about two degrees, as the base crystal and has a very high crystalline quality, comprises nitrogen and has a surface dislocation density below $10^5$ $cm^{-2}$. The release layer may have a surface dislocation density below $10^4$ $cm^{-2}$, below $10^3$ $cm^{-2}$, or below $10^2$ $cm^{-2}$. The release layer may have a c-plane dislocation density below $10^5$ $cm^{-2}$, below $10^4$ $cm^{-2}$, below $10^3$ $cm^{-2}$, or below $10^2$ $cm^{-2}$. In some embodiments, the strain in either or both of the a or c lattice constants of the epitaxial release layer, with respect to those of the base nitride crystal, is less than 0.1%, less than 0.01%, less than 0.005%, less than 0.002%, or less than 0.001%. In some embodiments, the release layer has an optical absorption coefficient above 5000 $cm^{-1}$ or above 5000 $cm^{-1}$ at wavelengths between about 700 nm and about 3077 nm and at wavelengths between about 3333 nm and about 6667 nm. In some embodiments, the release layer is substantially free of low angle grain boundaries, or tilt boundaries. In other embodiments, the release layer comprises at least two tilt boundaries, with the separation between adjacent tilt boundaries not less than 3 mm. In some embodiments, the flow of dopant precursor is terminated after a predetermined time interval but the flow of gallium-containing metalorganic precursor is continued, so as to deposit a high quality epitaxial layer. In some embodiments the high quality layer is doped, for example, with Si or O to form n-type material, with Mg or Zn to form p-type material, with a compensatory dopant, such as Fe or Co, to form semi-insulating material, or with a magnetic dopant, such as Fe, Ni, Co, or Mn, to form magnetic material, with dopant concentrations between $10^{16}$ $cm^{-3}$ and $10^{21}$ $cm^{-3}$.

In yet another set of embodiments, a doped $Al_xIn_yGa_{1-x-y}N$ layer is deposited on the base crystal by hydride vapor phase epitaxy (HVPE). At least one base crystal is placed on or fixed against a substrate holder in an HVPE reactor. The reactor is capable of generating a gallium-containing halide compound, such as (but not limited to), a gallium monochloride (GaCl), by flowing gaseous hydrogen chloride (HCl) over or past molten metallic gallium at a temperature in excess of 700 degrees Celsius. The gallium-containing halide compound is transported to the substrate by a carrier gas. The carrier gas may comprise at least one of nitrogen, hydrogen, helium, or argon. In a specific embodiment, the carrier gas comprises hydrogen for the final growth stage in one or more of the gas streams in the reactor. Ammonia ($NH_3$) is also transported to the substrate, either in pure form or diluted with a carrier gas. In a specific embodiment, the reactor pressure is held below atmospheric pressure (760 Torr) for at least the final stage of GaN film growth. In an embodiment, the gas composition comprises approximately 0-5% cobalt precursor, 32% $N_2$, 58% $H_2$, and the balance $NH_3$ and HCl, with a V:III ratio of 15:8, the growth pressure is 70 Torr, and the substrate temperature is approximately 862 degrees Celsius. The cobalt precursor may comprise at least one of cyclopentadienylcobalt dicarbonyl $((C_5H_5)Co(CO)_2)$, cobalt (II) acetylacetonate $(Co(CH_3C(O)CHC(O)CH_3)_2)$, cobalt tricarbonyl nitrosyl $(Co(CO)_3NO)$, dicobalt octacarbonyl $(Co_2(CO)_8)$, and tetracobalt dodecacarbonyl $(Co_4(CO)_{12})$. Growth is performed for a predetermined period of time, and occurs at a rate between 1 and 400 microns per hour. A black, Co-doped GaN layer is deposited on the base crystal, approximately 0.5-50 microns thick. The newly-deposited release layer has a high crystal quality and an optical absorption coefficient greater than 1000 $cm^{-1}$ across the entire visible spectrum, including the range between about 465 nm and about 700 nm. In some embodiments, the flow of dopant precursor is terminated after a predetermined time interval but the flow of gallium-containing metalorganic precursor is continued, so as to deposit a high quality epitaxial layer. In some embodiments the high quality layer is doped, for example, with Si or O to form n-type material, with Mg or Zn to form p-type material, with a compensatory dopant, such as Fe or Co, to form semi-insulating material, or with a magnetic dopant, such as Fe, Ni, Co, or Mn, to form magnetic material, with dopant concentrations between $10^{16}$ $cm^{-3}$ and $10^{21}$ $cm^{-3}$.

In another set of embodiments, the release layer comprises nitrogen and at least element selected from Si, Sc, Ti, V, Cr, Y, Zr, Nb, Mo, a rare earth element, Hf, Ta, and W. A metal layer may be deposited on the base crystal, to a thickness between about 1 nm and about 1 micron by sputtering, thermal evaporation, e-beam evaporation, or the like. The metal layer may then be nitrided by heating in a nitrogen-containing atmosphere such as ammonia to a temperature between about 600 degrees Celsius and about 1200 degrees Celsius. During the nitridation process the metal partially de-wets from the base crystal, creating nano-to-micro openings through which high quality epitaxy can take place. The nitridation step may be performed in an MOCVD reactor, in an HVPE reactor, or in an ammonothermal reactor immediately prior to deposition of a high quality epitaxial layer.

In some embodiments, the high quality epitaxial layer is grown in a separate step, by MOCVD, by MBE, or by HVPE, after deposition of the release layer. In another embodiment, the high quality epitaxial layer is grown ammonothermally. The high quality epitaxial layer may have a thickness between about 0.05 micron and about 500 microns. In some embodiments the thickness of the high quality epitaxial layer is between about one micron and about 50 microns.

The high quality epitaxial layer has the same crystallographic orientation, to within about two degrees, as the base crystal and has a very high crystalline quality, is between 0.1 micron and 50 microns thick, comprises nitrogen and has a surface dislocation density below $10^5$ $cm^{-2}$. The high quality epitaxial layer may have a surface dislocation density below $10^4$ cm$^{-2}$, below $10^3$ cm$^{-2}$, or below $10^2$ cm$^{-2}$. The high quality epitaxial layer may have a c-plane dislocation density below $10^5$ cm$^{-2}$, below $10^4$ cm$^{-2}$, below $10^3$ cm$^{-2}$, or below $10^2$ cm$^{-2}$. In some embodiments, the high quality epitaxial layer is substantially transparent, with an optical absorption coefficient below 100 cm$^{-1}$, below 50 cm$^{-1}$, below 5 cm$^{-1}$, or below 1 cm$^{-1}$ at wavelengths between about 700 nm and about 3077 nm and at wavelengths between about 3333 nm and about 6667 nm. In some embodiments, the high quality epitaxial layer is substantially free of low angle grain boundaries, or tilt boundaries. In other embodiments, the high quality epitaxial layer comprises at least two tilt boundaries, with the separation between adjacent tilt boundaries not less than 3 mm. The high quality epitaxial layer may have impurity concentrations of O, H, C, Na, and K below $1\times10^{17}$ cm$^{-2}$, $2\times10^{17}$ cm$^{-3}$, $1\times10^{17}$ cm$^{-3}$, $1\times10^{16}$ cm$^{-3}$, and $1\times10^{16}$ cm$^{-3}$, respectively, as quantified by calibrated secondary ion mass spectrometry (SIMS), glow discharge mass spectrometry (GDMS), interstitial gas analysis (IGA), or the like.

In a specific embodiment, the high quality epitaxial layer has an orientation within five degrees of m-plane and the FWHM of the 1-100 x-ray rocking curve of the top surface is below 300 arc sec, below 100 arc sec, or below 50 arc sec. In another specific embodiment, the high quality epitaxial layer has an orientation within five degrees of a-plane and the FWHM of the 11-20 x-ray rocking curve of the top surface is below 300 arc sec, below 100 arc sec, or below 50 arc sec. In yet another specific embodiment, the high quality epitaxial layer has an orientation within five degrees of a semi-polar orientation selected from $\{1\ -1\ 0\ \pm1\}$, $\{1\ -1\ 0\ \pm2\}$, $\{1\ -1\ 0\ \pm3\}$, $\{2\ -2\ 0\ \pm1\}$, and $\{1\ 1\ -2\ \pm2\}$ and the FWHM of the lowest-order semipolar symmetric x-ray rocking curve of the top surface is below 300 arc sec, below 100 arc sec, or below 50 arc sec. In another specific embodiment, the high quality epitaxial layer has an orientation within five degrees of (0001) c-plane and the FWHM of the 0002 x-ray rocking curve of the top surface is below 300 arc sec, below 100 arc sec, or below 50 arc sec. In still another specific embodiment, the high quality epitaxial layer has an orientation within five degrees of (000-1) c-plane and the FWHM of the 000-2 x-ray rocking curve of the top surface is below 300 arc sec, below 100 arc sec, or below 50 arc sec.

The nitride crystal or wafer with a removable surface layer may be incorporated into a semiconductor structure, as shown in FIG. 2. The semiconductor structure may comprise at least one $Al_xIn_yGa_{(1-x-y)}N$ epitaxial semiconductor layer, where $0 \leq x, y, x+y \leq 1$. The epitaxial semiconductor layer may be deposited on the wafer, for example, by metalorganic chemical vapor deposition (MOCVD), by molecular beam epitaxy (MBE), or by hydride vapor phase epitaxy (HVPE) according to methods that are known in the art. At least one electrical contact may be deposited on the semiconductor structure, for example, by sputtering, thermal evaporation, or electron-beam evaporation. The semiconductor structure may form a portion of a gallium-nitride-based electronic device or opto-electronic device, such as a light emitting diode, an ultraviolet light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, and combinations thereof.

The wafer, comprising at least one semiconductor structure, may be separated into one or more discrete dies, as shown in FIG. 2. For example, the backside of the wafer may be mechanically or laser scribed and then cleaved to form one or more discrete dies. At least one die may be flip-chip bonded to a submount or to a metal substrate. The submount may comprise silicon, aluminum nitride, aluminum oxide, another ceramic, or the like. In some embodiments, at least one electrical contact is attached to interconnect metallization on the submount or to the metal substrate by means of a solder joint. The solder joint may comprise at least one of In, PbSn, and AuSn. The solder joint may be formed by gold plating the back of the reflective metallic electrical contact, evaporating Sn onto the gold layer, flipping the die and placing it in contact with a Au-coated submount, and heating to a temperature of about 280 degrees Celsius. The die may be additionally bonded to the submount or metal substrate by at least one of epoxy and wax.

The semiconductor structure, comprising at least one epitaxial semiconductor layer, may be separated from the nitride base crystal, or at least from the portion of the nitride base crystal still attached to the die, as shown in FIG. 2. The release layer may be illuminated by laser radiation at a wavelength at which the release layer has an optical absorption coefficient greater than 1000 cm$^{-1}$ and the base crystal is substantially transparent, with an optical absorption coefficient less than 50 cm$^{-1}$. In one set of embodiments, the release layer is illuminated by laser radiation through the nitride base crystal. With a nitride base crystal having a thickness of approximately 300 microns and an optical absorption coefficient less than 50 cm$^{-1}$, the fraction of laser energy incident on the release layer is greater than approximately $e^{-(0.03\times50)}$, or 22%. In a preferred embodiment, with a nitride base crystal having a thickness of approximately 300 microns and an optical absorption coefficient less than 5 cm$^{-1}$, the fraction of laser energy incident on the release layer after passing through the nitride base crystal is greater than approximately $e^{-(0.03\times5)}$, or 86%. With a release layer having a thickness of approximately one micron and an optical absorption coefficient greater than 1000 cm$^{-1}$, the fraction of laser energy incident on the release layer that is absorbed by the release layer is approximately $[1-e^{-(0.0001\times1000)}]$, or 10%. In a preferred embodiment, with a release layer having a thickness of greater than approximately 5 microns or an optical absorption coefficient greater than 5000 cm$^{-1}$, the fraction of laser energy incident on the release layer that is absorbed by the release layer is greater than approximately $[1-e^{-(0.0005\times1000)}]$, or 40%. For thicker release layers or higher absorption coefficients, the fraction of laser energy absorbed by the release layer will be higher still. Absorption of the laser energy by the release layer occurs on a very short length scale, causing considerable local heating. Without wishing to be bound by theory, I believe that the local heating causes partial or complete decomposition of the release layer and/or a thin portion of the nitride crystal in direct contact with the release layer, forming metal and $N_2$, which may occur as a thin layer or as micro- or nano-bubbles. The thin layer or micro- or nano-bubbles of $N_2$ mechanically weakens the interface between the nitride base crystal and the high quality epitaxial layer, enabling facile separation of the nitride base crystal from the high quality epitaxial layer, which is in turn bonded to at least one semiconductor device layer. The optimal degree of weakening of the interface, without causing undesired damage to the high quality epitaxial layer or the semiconductor structure, is achieved by adjusting the die temperature, the laser power, the laser spot size, the laser pulse duration, and/or the number of laser pulses. The laser fluence to effect separation may be between 300 and 900 millijoules per square centimeter or between about 400 mJ/cm$^2$ and about 750 mJ/cm$^2$. The uniformity of the laser beam may be improved by inclusion of a beam homogenizer in the beam path, and the beam size may be about 4 mm by 4 mm. In some embodiments, the laser beam is scanned or rastered across the release layer rather than being held stationary. Separation may be performed at a temperature above the melting point of the metal produced by decomposition, e.g., above about 30 degrees Celsius in the case of gallium metal.

Examples of wavelengths at which laser illumination may be appropriate for separation of the nitride base crystal from the high quality epitaxial layer are listed in Table 1.

TABLE 1

Possible laser wavelengths for separation of AlInGaN layers.

| Wavelength (nm) | Type of laser |
| --- | --- |
| 351 | XeF |
| 364 | Ar$^+$ |
| 416 | Kr$^+$ |
| 428 | N$_2^+$ |
| 442 | HeCd |
| 457.9 | Ar$^+$ |
| 476.5 | Ar$^+$ |
| 488.0 | Ar$^+$ |
| 496.5 | Ar$^+$ |
| 501.7 | Ar$^+$ |
| 514.5 | Ar$^+$ |
| 530.9 | Kr$^+$ |
| 532 | Nd:YAG, doubled |
| 568.2 | Kr$^+$ |
| 588 | Er:YAG |
| 647.1 | Kr$^+$ |
| 676.4 | Kr$^+$ |
| 694.3 | Ruby |
| 735 | Er:YAG |
| 752.5 | Kr$^+$ |
| 755 | Alexandrite |
| 980 | Er:YAG |
| 1030 | Yb:YAG |
| 1064 | Nd:YAG |
| 1064 | Nd:YVO$_4$ |
| 1470 | Er:YAG |
| 2940 | Er:YAG |

After separation of the high quality epitaxial layer from the nitride base crystal, any residual gallium, indium, or other metal or nitride on the newly exposed back surface of the high quality epitaxial layer may be removed by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The back side of the high quality epitaxial layer may be further cleaned or damage removed by dry-etching in at least one of Ar, Cl$_2$, and BCl$_3$, by techniques such as chemically-assisted ion beam etching (CAIBE), inductively coupled plasma (ICP) etching, or reactive ion etching (RIE). The back side of the high quality epitaxial layer may be further treated by chemical mechanical polishing.

In some embodiments, traces of the release layer may remain after laser liftoff or etching from the edges of the release layer. Residual release layer material may be removed by photoelectrochemical etching, illuminating the back side of the high quality epitaxial layer with radiation at a wavelength at which the release layer has an optical absorption coefficient greater than 1000 cm$^{-1}$ and the high quality epitaxial layer is substantially transparent, with an optical absorption coefficient less than 50 cm$^{-1}$.

In another embodiment, the semiconductor structure, comprising at least one epitaxial semiconductor layer, is separated from the nitride base crystal, or at least from the portion of the nitride base crystal still attached to the die by means of chemical etching of the release layer. In one embodiment, the edge of the die, including a portion of the release layer, is treated with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. In one specific embodiment, the edge of the release layer is etched by treatment in a mixture of 200 milliliters of deionized water, 50 grams of diammonium cerium nitrate, Ce(NH$_4$)$_2$(NO$_3$)$_6$, and 13 milliliters of perchloric acid, HClO$_4$, at approximately 70 degrees Celsius. At least one edge of the release layer is etched away, mechanically weakening the interface between the nitride base crystal and the high quality epitaxial layer and enabling facile separation of the nitride base crystal from the high quality epitaxial layer, which is in turn bonded to at least one semiconductor device layer. The right degree of weakening of the interface, without causing undesired damage to the high quality epitaxial layer or the semiconductor structure, is achieved by adjusting the temperature and time of the chemical treatment.

After separation of the high quality epitaxial layer from the nitride base crystal, any residual gallium, indium, release layer material, or other metal or nitride on the newly exposed back surface of the high quality epitaxial layer may be removed by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The back side of the high quality epitaxial layer may be further cleaned or damage removed by dry-etching in at least one of Ar, Cl$_2$, and BCl$_3$, by techniques such as chemically-assisted ion beam etching (CAIBE), inductively coupled plasma (ICP) etching, or reactive ion etching (RIE). The back side of the high quality epitaxial layer may be further treated by chemical mechanical polishing.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A nitride crystal with a removable surface layer, comprising:
    a high quality nitride base crystal, comprising a nitrogen species and having a surface dislocation density below 10$^5$ cm$^{-2}$;
    a release layer having an optical absorption coefficient greater than 1000 cm$^{-1}$ at least one wavelength where the high quality nitride base crystal is substantially transparent, with an optical absorption coefficient less than 50 cm$^{-1}$, the release layer being disposed on the nitride base crystal; and
    a high quality epitaxial layer, between 0.05 micron and 500 microns thick, comprising nitrogen and having a surface dislocation density below 10$^5$ cm$^{-2}$, the epitaxial layer being disposed on the release layer.

2. The nitride crystal of claim 1, wherein the thickness of the high quality epitaxial layer is between about 1 micron and about 50 microns.

3. The nitride crystal of claim 1, wherein the dislocation density of the high quality nitride base crystal and of the high quality epitaxial layer is below $10^4$ cm$^{-2}$.

4. The nitride crystal of claim 3, wherein the dislocation density of the high quality nitride base crystal and of the high quality epitaxial layer is below $10^3$ cm$^{-2}$.

5. The nitride crystal of claim 4, wherein the dislocation density of the high quality nitride base crystal and of the high quality epitaxial layer is below $10^2$ cm$^{-2}$.

6. The nitride crystal of claim 1, wherein the surface orientation of the high quality epitaxial layer is within 5 degrees of {1 –1 0 0}.

7. The nitride crystal of claim 1, wherein the surface orientation of the high quality epitaxial layer is within 5 degrees of {1 1 –2 0}.

8. The nitride crystal of claim 1, wherein the surface orientation of the high quality epitaxial layer is within 5 degrees of {1 –1 0 ±1}.

9. The nitride crystal of claim 1, wherein the surface orientation of the high quality epitaxial layer is within 5 degrees of {1 –1 0 ±2}.

10. The nitride crystal of claim 1, wherein the surface orientation of the high quality epitaxial layer is within 5 degrees of {1 –1 0 ±3}.

11. The nitride crystal of claim 1, wherein the surface orientation of the high quality epitaxial layer is within 5 degrees of {2 –2 0 ±1}.

12. The nitride crystal of claim 1, wherein the surface orientation of the high quality epitaxial layer is within 5 degrees of {1 1 –2 ±2}.

13. The nitride crystal of claim 1, wherein the nitride base crystal and the epitaxial layer comprise an $Al_xIn_yGa_{1-x-y}N$ layer, where $0 \leq x, y, x+y \leq 1$.

14. The nitride crystal of claim 1, wherein the release layer comprises $Al_xIn_yGa_{1-x-y}N$, where $0 \leq x, y, x+y \leq 1$, and at least one impurity.

15. The nitride crystal of claim 14, wherein the at least one impurity comprises cobalt.

16. The nitride crystal of claim 1, wherein the release layer comprises nitrogen and at least element selected from Si, Sc, Ti, V, Cr, Y, Zr, Nb, Mo, a rare earth element, Hf, Ta, and W.

17. The nitride crystal of claim 16, wherein the release layer comprises nitrogen and chromium.

18. The nitride crystal of claim 1, wherein the release layer has an optical absorption coefficient greater than 5000 cm$^{-1}$ at least one wavelength where the base crystal has an optical absorption coefficient less than 5 cm$^{-1}$.

19. The nitride crystal of claim 1, wherein the high quality epitaxial layer is between one and five microns thick.

20. The nitride crystal of claim 1, wherein the base crystal, the release layer, and the high quality epitaxial layer are substantially free of voids.

21. The nitride crystal of claim 1, wherein the release layer comprises a gallium and indium containing species.

22. The nitride crystal of claim 1, wherein the release layer is substantially black in color.

23. A nitride crystal with a release layer, comprising:
a high quality $Al_xIn_yGa_{1-x-y}N$ base crystal, where $0 \leq x, y, x+y \leq 1$, having a surface dislocation density below $10^5$ cm$^{-2}$; and
a release layer comprising $Al_xIn_yGa_{1-x-y}N$ and at least one impurity, where $0 \leq x, y, x+y \leq 1$, having an optical absorption coefficient greater than 1000 cm$^{-1}$ at at least one wavelength where the base crystal is substantially transparent, with an optical absorption coefficient less than 50 cm$^{-1}$, the release layer being disposed on the base crystal.

24. The nitride crystal of claim 23, wherein the at least one impurity comprises cobalt.

25. The nitride crystal of claim 23, wherein the dislocation density of the high quality nitride base crystal and of the release layer is below $10^4$ cm$^{-2}$.

26. The nitride crystal of claim 25, wherein the dislocation density of the high quality nitride base crystal and of the release layer is below $10^3$ cm$^{-2}$.

27. The nitride crystal of claim 26, wherein the dislocation density of the high quality nitride base crystal and of the release layer is below $10^2$ cm$^{-2}$.

28. The nitride crystal of claim 23, wherein the surface orientation of the release layer is within 5 degrees of {1 –1 0 0}.

29. The nitride crystal of claim 23, wherein the surface orientation of the release layer is within 5 degrees of {1 1 –2 0}.

30. The nitride crystal of claim 23, wherein the surface orientation of the release layer is within 5 degrees of {1 –1 0 ±1}.

31. The nitride crystal of claim 23, wherein the surface orientation of the release layer is within 5 degrees of {1 –1 0 ±2}.

32. The nitride crystal of claim 23, wherein the surface orientation of the release layer is within 5 degrees of {1 –1 0 ±3}.

33. The nitride crystal of claim 23, wherein the surface orientation of the release layer is within 5 degrees of {2 –2 0 ±1}.

34. The nitride crystal of claim 23, wherein the surface orientation of the release layer is within 5 degrees of {1 1 –2 ±2}.

35. The nitride crystal of claim 23, wherein the release layer has an optical absorption coefficient greater than 5000 cm$^{-1}$ at at least one wavelength where the base crystal has an optical absorption coefficient less than 5 cm$^{-1}$.

36. The nitride crystal of claim 23, wherein the release layer is substantially black in color.

37. The nitride crystal of claim 23, wherein the strain in either or both of the a or c lattice constants of the epitaxial release layer, with respect to those of the base nitride crystal, is less than 0.01% an 0.02%.

* * * * *